United States Patent
Liu et al.

(10) Patent No.: US 8,768,034 B2
(45) Date of Patent: Jul. 1, 2014

(54) MOTION COMPENSATED MR IMAGING SYSTEM

(75) Inventors: Kecheng Liu, Zhejiang Hangzhou (CN); Tiejun Zhao, Pittsburgh, PA (US)

(73) Assignee: Siemens Medical Solutions USA, Inc., Malvern, PA (US)

(*) Notice: Subject to any disclaimer, the term of this patent is extended or adjusted under 35 U.S.C. 154(b) by 128 days.

(21) Appl. No.: 13/603,679

(22) Filed: Sep. 5, 2012

(65) Prior Publication Data

US 2013/0251225 A1  Sep. 26, 2013

Related U.S. Application Data

(60) Provisional application No. 61/613,006, filed on Mar. 20, 2012.

(51) Int. Cl.
*G06K 9/00* (2006.01)

(52) U.S. Cl.
USPC ............................................ 382/131; 382/275

(58) Field of Classification Search
USPC ................... 382/100, 128–132, 275; 600/410
See application file for complete search history.

(56) References Cited

U.S. PATENT DOCUMENTS

| | | | |
|---|---|---|---|
| 6,073,041 A * | 6/2000 | Hu et al. ....................... | 600/410 |
| 7,005,853 B2 * | 2/2006 | Tsao et al. .................... | 324/309 |
| 7,945,305 B2 | 5/2011 | Aggarwal et al. | |
| 8,126,237 B2 | 2/2012 | Kimura | |
| 8,195,417 B2 | 6/2012 | Feiweier et al. | |
| 8,345,945 B2 * | 1/2013 | Song et al. .................... | 382/131 |
| 8,649,585 B2 * | 2/2014 | Xue et al. ...................... | 382/131 |
| 2011/0022375 A1 | 1/2011 | Odille et al. | |
| 2011/0071382 A1 | 3/2011 | Miyazaki et al. | |
| 2011/0116683 A1 | 5/2011 | Kramer et al. | |
| 2012/0148128 A1 | 6/2012 | Chefd et al. | |
| 2012/0148137 A1 | 6/2012 | Kimura | |

OTHER PUBLICATIONS

P. Roder and J. Willig-Onwuachi, "GRAPPA navigators: motion correction with parallel imaging", Proc. Intl. Soc. Mag. Reson. Med. 16 (2008) p. 1291 (1 sheet).

Neil M. Rofsky, MD, et al., "Abdominal MR Imaging iwth a Volumetric Interpolated Breath-hold Examination", Radiology 1999; 212:876-884.

(Continued)

*Primary Examiner* — Shefali Goradia
(74) *Attorney, Agent, or Firm* — Peter R. Withstandley

(57) ABSTRACT

A method provides motion corrected MR image data in an MR imaging system. The method employs an imaging method for acquiring k-space data of a k-space data array during an imaging scan and the k-space data represents image data of a patient anatomical region. The method acquires k-space data associated with a central region of the k-space data array and subsequently acquires k-space data external to the central region of the k-space data array. The method acquires a motion signal indicating respiratory motion at least during the acquisition of the k-space data external to the central region and compares the motion signal with a predetermined threshold. The method identifies acquired k-space data corresponding to acquisition periods when the motion signal exceeds the threshold and excludes use of the identified acquired k-space data in image reconstruction using the remaining acquired k-space data.

25 Claims, 7 Drawing Sheets

(56) References Cited

OTHER PUBLICATIONS

Mark A. Griswold, et al., "Generalized Autocalibrating Partially Parallel Acquisitions (GRAPPA)", Magnetic Resonance in Medicine 47: 1202-1210 (2002).

M. Bydder, et al., "SMASH Navigators", Magnetic Resonance in Medicine 49:493-500 (2003).

Wei Lin, et al., "Motion Correction Using an Enhanced Floating Navigator and GRAPPA Operations", Magnetic Resonance in Medicine 63:339-348 (2010).

C. Bookwalter, et al., "Motion Artifact Removal by Retrospective Resolutoin Reduction (MARs)", Proc. Intl. Soc. Mag. Reson. Med. 19 (2011) p. 4603 (1 sheet).

* cited by examiner

MOTION COMPENSATED MR IMAGING SYSTEM

CROSS-REFERENCE TO RELATED APPLICATIONS

This application is a non-provisional of, and claims priority to, U.S. provisional patent application Ser. No. 61/613,006 by K. Liu et al. filed on Mar. 20, 2012.

FIELD OF THE INVENTION

This invention concerns a system for providing motion corrected MR image data in an MR imaging system by excluding use of acquired k-space data in image reconstruction that is acquired in acquisition periods when a respiratory motion indicative signal exceeds a threshold.

BACKGROUND OF THE INVENTION

MRI body or body relevant region image quality is affected by patient respiration motion. Respiration related MR imaging artifacts occur if they are not suppressed or reduced, which leads to ghosting that may overlay a region of interest or blurring which reduces image quality for clinical diagnosis. Respiration related patient physical motion is unavoidable during MR imaging, especially for body region imaging, such as of the abdomen, spine, pelvis and heart. Respiration inspiration and expiration, is a slow physical motion with frequencies ranging around 60 Hz. During a respiration cycle, the physical position of many organs, such as of a heart, liver or diaphragm changes resulting in inconsistency in collected MR data (phase shifts) during MR data acquisition. In addition to organ physical displacement, respiration also leads to known pseudo-periodic scanner base magnetic field (B0) variations that may cause phase variations in the acquired data. Due to these data inconsistencies, reconstructed MR images are normally contaminated with ghosting, blurring and other artifacts as shown in FIG. 1. FIG. 1A shows an image indicating respiratory motion related artifacts and FIG. 1B shows a corresponding comparison image without respiratory motion artifacts providing improved diagnosis information.

A known system reduces respiratory motion related artifacts by asking a patient to hold his breath (breath-hold=BH) while collecting data (scanning). For a healthy patient breathhold typically varies from 15 to 30 seconds depending on individual personal conditions. However, for many patients, a long breathhold may be impossible to achieve, depending on patient physical condition, age and health. Consequently known systems employ fast imaging methods including shortened TR (time between successive RF excitation pulses) using a fast magnetic field gradient (HW), applying parallel imaging with multi-receiving coils and parallel data processing methods such as SENSE ((SENSitivity Encoding) and GRAPPA (Generalized autocalibrating partially parallel acquisitions (GRAPPA).

Another known system uses gating to synchronize MR data acquisition with a pseudo respiration cycle limiting data acquisition to periods when organs are in a certain position. This method allows patients free respiration without breathhold using an external motion sensor (e.g., a respiration belt) or an internal MR navigator image acquisition method to track respiration motion during data acquisition, and trigger data collection when organs are in a certain position. This method is relatively inefficient resulting in prolonged scanning time and increase in patient discomfort. This method also typically results in variable image contrast due to long and variable repetition time (TR). The use of segmented acquisition improves data collection efficiency at the cost of image quality reduction by allowing organ motion within a certain range but the scanning time may still be too long for some patients.

FIG. 2 shows a known system for Motion Artifact Removal by Retrospective Resolution Reduction (MARs) using a breathhold strategy. Clean k-space image data without motion error is collected at the beginning of breath-hold as reference to distinguish the data collected in a later phase of breath-hold, potentially affected by physical motion. Correlation function 207 determines correlation between image representative data from parallel RF coils 203, 205, to derive a Motion Artifact Removal parameter 209 which is averaged and compared against a threshold in unit 211 for determining an indicator of motion artifact used for identifying corrupted k-space data lines. The identified corrupted k-space data lines are zero filled in unit 215. Images 220 and 222 are images with and without MARs correction respectively. The known MARs system collects the most important data, e.g. the center of k-space, at the beginning while patients can still hold their breath and collects less significant data (high k-space data) later. At the end of the data acquisition, the data with respiration motion contaminated data is discarded to remove the artifacts by sacrificing some resolution. For example, suppose a requested breathhold is 15 seconds and after 10 seconds the patient cannot maintain breathhold, the last 5 seconds of MR data is contaminated with motion. However, this data is less significant as it is outside the k-space center and can be discarded as a trade-off between artifact-free image data and image resolution and thus achieve an improved clinical diagnosis image. Selection and discarding "bad" data during a late phase of breathhold is important in this method and reliability of the known system is largely dependent on the acquired signal quality, i.e. signal-noise-ratio (SNR) and the method is vulnerable to a poor SNR which is common for non-central k-space data. A system according to invention principles addresses these deficiencies and related problems.

SUMMARY OF THE INVENTION

An MR imaging system reduces respiratory related motion artifacts using measured information while demanding little patient effort and cooperation with minimal impact on image processing time and provides improved image quality in clinical abdominal MR applications, for example. A method provides motion corrected MR image data in an MR imaging system. The method employs an imaging method for acquiring k-space data of a k-space data array during an imaging scan. The k-space data represents image data of a patient anatomical region. The method acquires k-space data associated with a central region of the k-space data array and subsequently acquires k-space data external to the central region of the k-space data array. The method also acquires a motion signal indicating respiratory motion at least during the acquisition of the k-space data external to the central region and compares the motion signal with a predetermined threshold. The method identifies acquired k-space data corresponding to acquisition periods when the motion signal exceeds the threshold and excludes use of the identified acquired k-space data in image reconstruction using the remaining acquired k-space data.

DETAILED DESCRIPTION OF THE INVENTION

A system addresses respiratory related motion artifacts in medical imaging by exploiting measured information while minimizing need for patient breathhold cooperation and without substantially increasing image processing time, in clinical abdominal MR applications, for example. In discarding motion contaminated image data, it is desired to keep as much relevant information as possible. Known systems discard relevant image information and use just part of the acquired image data in employing sub-optimal methods to reduce respiratory motion artifacts. For instance, known methods typically use a gating method without employing fast acquisition methods or during patient breathhold use a fast acquisition without using gating information and discard useful image information.

A system according to invention principles uses breathhold, center-out k-space encoding and advantageously selects and discards motion contaminated data in a postprocessing stage comprehensively based on available respiratory related information. The system improves robustness of motion artifact suppression and maximizes acquisition and use of clean data (thus providing higher spatial resolution). In one embodiment, the system uses a respiratory motion sensor (such as a belt for respiratory gating, or an image navigator method) to identify motion contaminated data to discard during image reconstruction. The system in one embodiment employs center-out encoding and breathhold using a respiration belt for respiratory motion detection to avoid cost increase or prolonging imaging time. Recorded respiratory information may be reliably used retrospectively and may be used in conjunction with signal correlation.

Figures 1A, 1B:
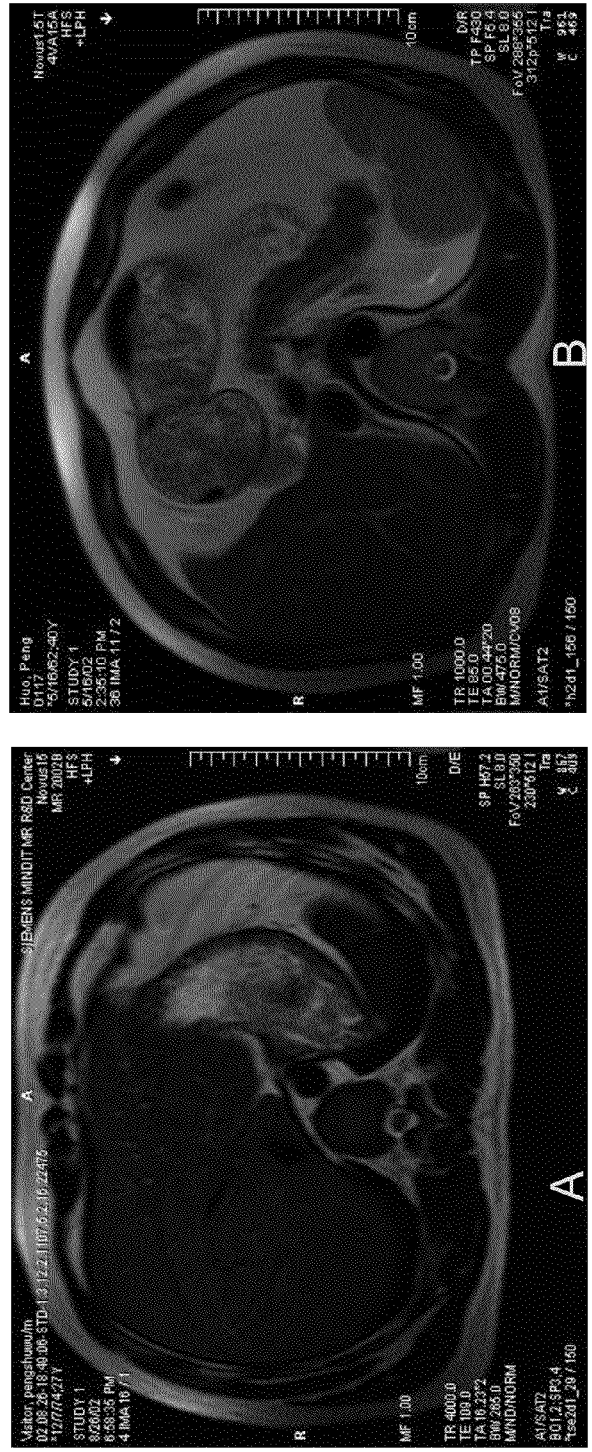
FIG. 1A shows an image indicating respiratory motion related artifacts and FIG. 1B shows a corresponding comparison image without respiratory motion artifacts providing improved diagnosis information.
Figure 2:
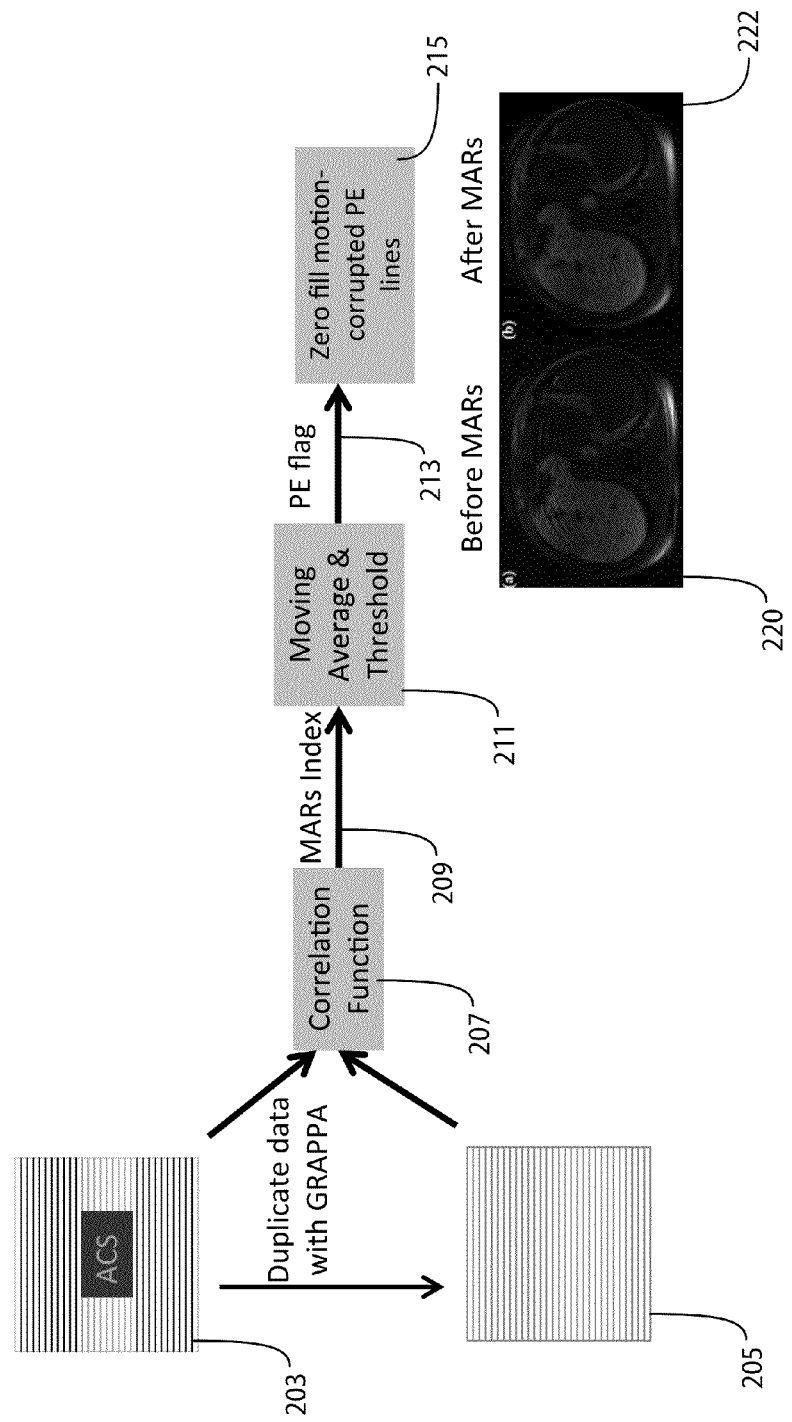
FIG. 2 shows a system for Motion Artifact Removal by Retrospective Resolution Reduction (MARs).
Figure 3:
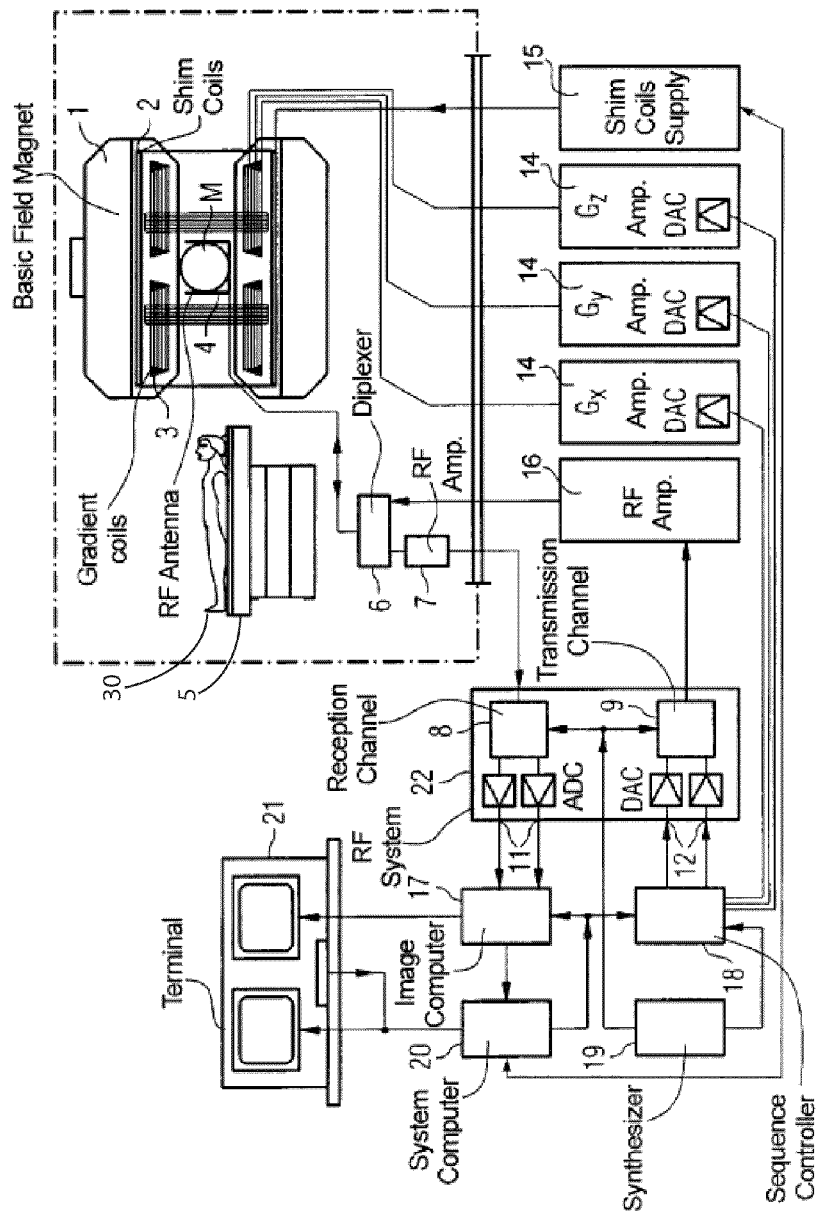
FIG. 3 shows a system for providing motion corrected MR image data in an MR imaging system, according to an embodiment of the invention.

FIG. 3 shows a system for providing motion corrected MR image data in an MR imaging system. In the basic field magnet 1, a cylinder-shaped gradient coil system comprising magnetic field gradient generator 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times. Homogeneity of the base magnetic field B0 is corrected using shim coils 2 electrically powered by shim coil supply 15.

Within the gradient field system 3, radio-frequency (RF) coils comprising RF (Radio Frequency) signal generator 4, are located which converts the radio-frequency pulses emitted by a radio-frequency power amplifier 16 via multiplexer 6 into a magnetic alternating field in order to excite the nuclei and align the nuclear spins of a region of patient 30. In one embodiment, patient 30 is fitted with a respiration belt for detecting respiratory movement of patient 30. In an interleaved embodiment, the RF (Radio Frequency) signal generator generates RF excitation pulses in an anatomical region of interest and enables subsequent acquisition of associated RF echo data. The magnetic field gradient generator generates anatomical slice specific magnetic field gradients for phase encoding and readout RF data acquisition. Imaging computer 17 reconstructs an image from the processed acquired RF echo pulse data.

System 10 employs a method for providing motion corrected MR image data in an MR imaging system. System 10 acquires k-space data of a k-space data array during an imaging scan. The k-space data represents image data of a patient anatomical region. System 10 acquires k-space data associated with a central region of the k-space data array and subsequently acquires k-space data external to the central region of the k-space data array. Computer 17 acquires a motion signal indicating respiratory motion of patient 30 at least during the acquisition of the k-space data external to the central region. Computer 17 compares the motion signal with a predetermined threshold and identities acquired k-space data corresponding to acquisition periods when the motion signal exceeds the threshold. Computer 17 excludes use of the identified acquired k-space data in image reconstruction using the remaining acquired k-space data.

Figure 4:
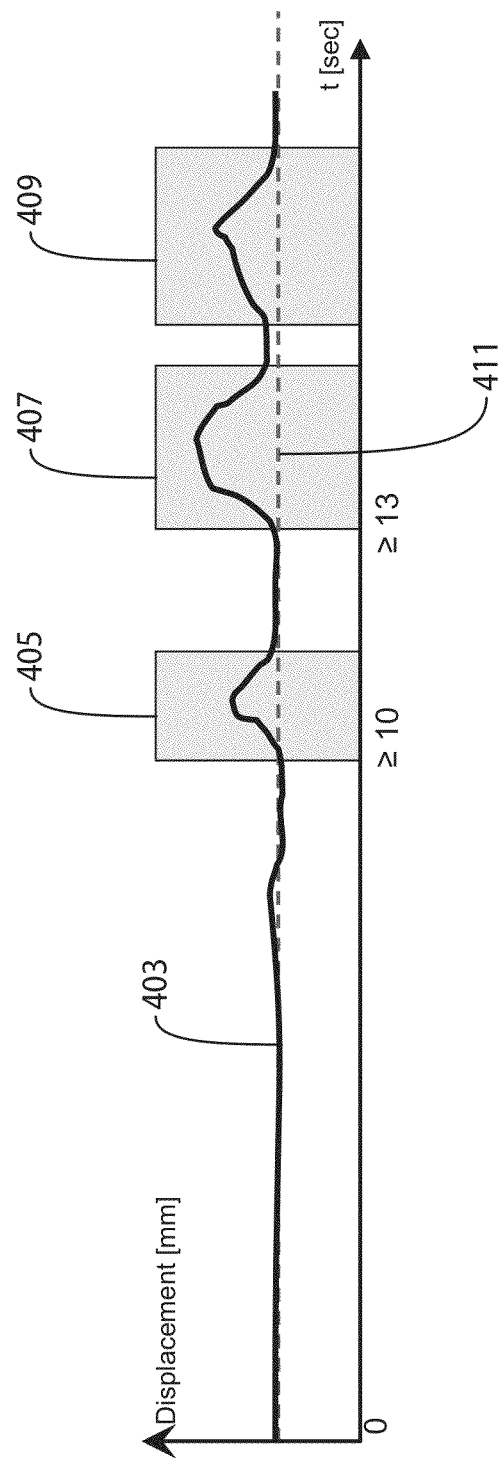
FIG. 4 shows recorded respiratory displacement of a patient over time used for exclusion of image representative data with respiration motion contamination, according to an embodiment of the invention.

FIG. 4 shows recorded respiratory displacement 403 of a patient over time used for exclusion of image representative data with respiration motion contamination. In one embodiment, breathhold with a fast imaging method and center-out K-space acquisition is used to acquire significant data during motionless periods. A respiratory sensor (e.g., a belt, not shown to preserve drawing clarity) on patient 30 is also used concurrently with an image data collection process to record time-variant physical motion (displacement) that is mainly introduced by respiration motion. Solid curve 403 illustrates the real recorded patient respiration related physical motion and dashed line 411 represents the ideal case (no motion) during breath-hold. In a later phase of breathhold (for instance after 10 sec of breathhold), motion occurs as marked by shaded blocks 405, 407, 409 for some patients. Since center-out encoding is used, the k-space peripheral (high frequency content) data having poor SNR is collected in a late phase of breathhold. Computer 17 identifies "bad" image representative k-space data to be discarded as k-space data acquired during shaded blocks 405, 407, 409 when respiratory displacement 403 exceeds a predetermined threshold. Thus, the system advantageously comprehensively uses information to distinguish "good" and "bad" data for final image reconstruction, avoiding vulnerability to SNR related degradation of image reconstruction, potentially resulting in unreliable image quality, either still contaminated by motion artifacts by retaining some "bad" data or excessive loss of spatial resolution by discarding "good" data.

Figure 5:
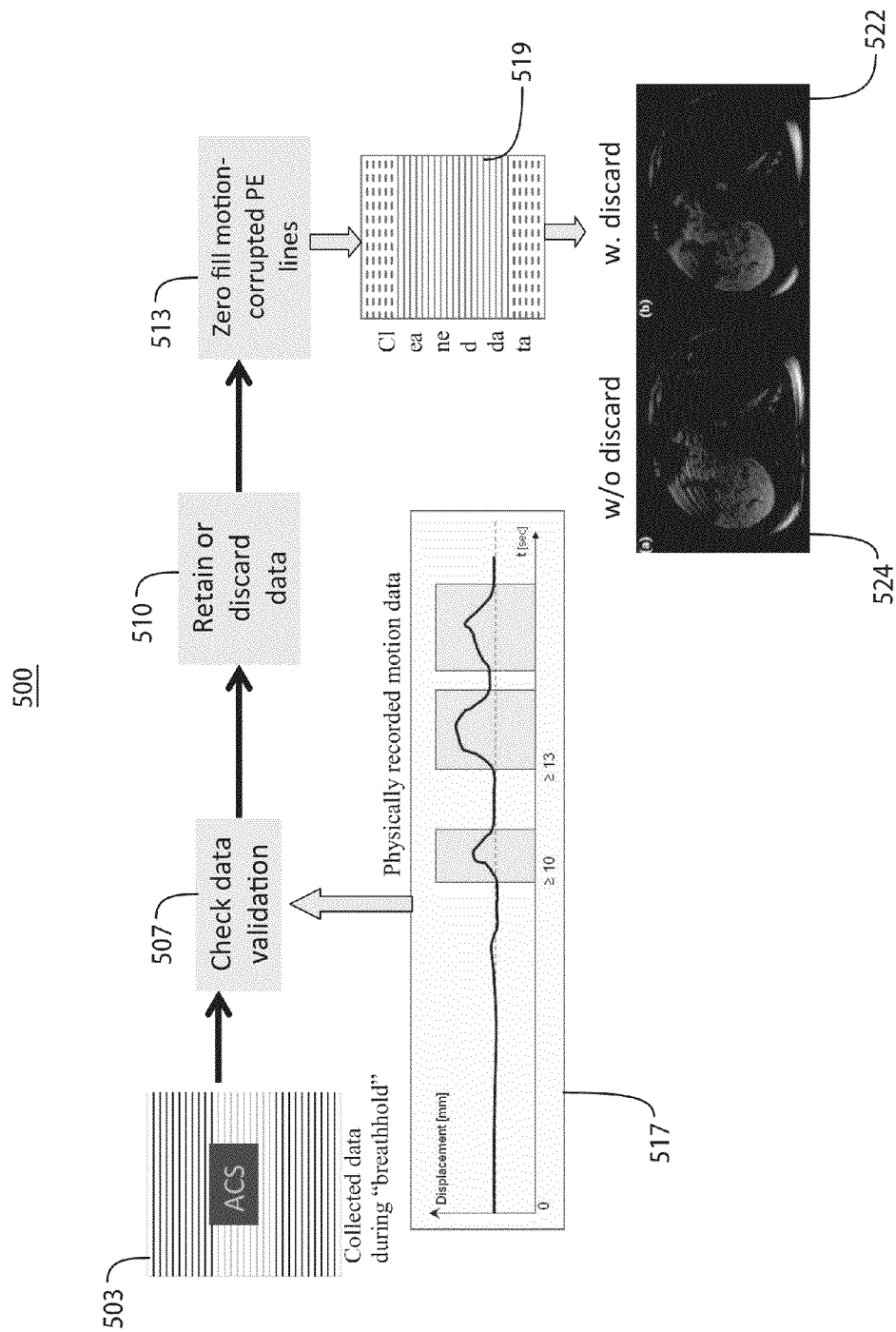
FIG. 5 shows a system for retrospectively using recorded physical motion information to identify data in k-space to be discarded from image reconstruction, according to an embodiment of the invention.

FIG. 5 shows system 500 for retrospectively using recorded physical motion information to identify data in k-space to be discarded from image reconstruction. The system, before image reconstruction, retrospectively uses the recorded motion data to distinguish whether data is clean or contaminated by discarding collected image data acquired in the presence of motion. System 500 retrospectively uses respiration tracking data synchronized with acquired k-space data for discarding motion contaminated image representative portions of the k-space data. Imaging system 10 (FIG. 3) performs a parallel RF coil, short TR, enhanced speed acquisition of k-space image data in step 503. The enhanced speed acquisition is performed by using patient breathhold to ensure central k-space data is free from motion introduced data error. A motion sensor such as a respiratory belt or other sensor attached to a patient or an imaging method, is used in step 517 to record a motion signal displacement synchronized with acquired k-space image data and indicating patient physical respiratory motion during the course of the parallel RF coil, short TR, k-space image data acquisition of step 503.

Computer 17 compares the motion signal displacement with a predetermined threshold in step 507 to identify signal portions and corresponding k-space data where the motion signal displacement exceeds the predetermined threshold. In step 510 computer 17 discards the identified k-space data corresponding to acquisition periods when the motion signal displacement exceeds the threshold. In step 513, computer 17 performs image reconstruction using cleaned data 519 comprising the remaining acquired k-space data. In one embodiment, computer 17 stores zero fill data in the discarded k-space data portions to replace motion contaminated data. Images 522 and 524 are images derived with and without motion determined discard of k-space data, respectively.

Figure 6:
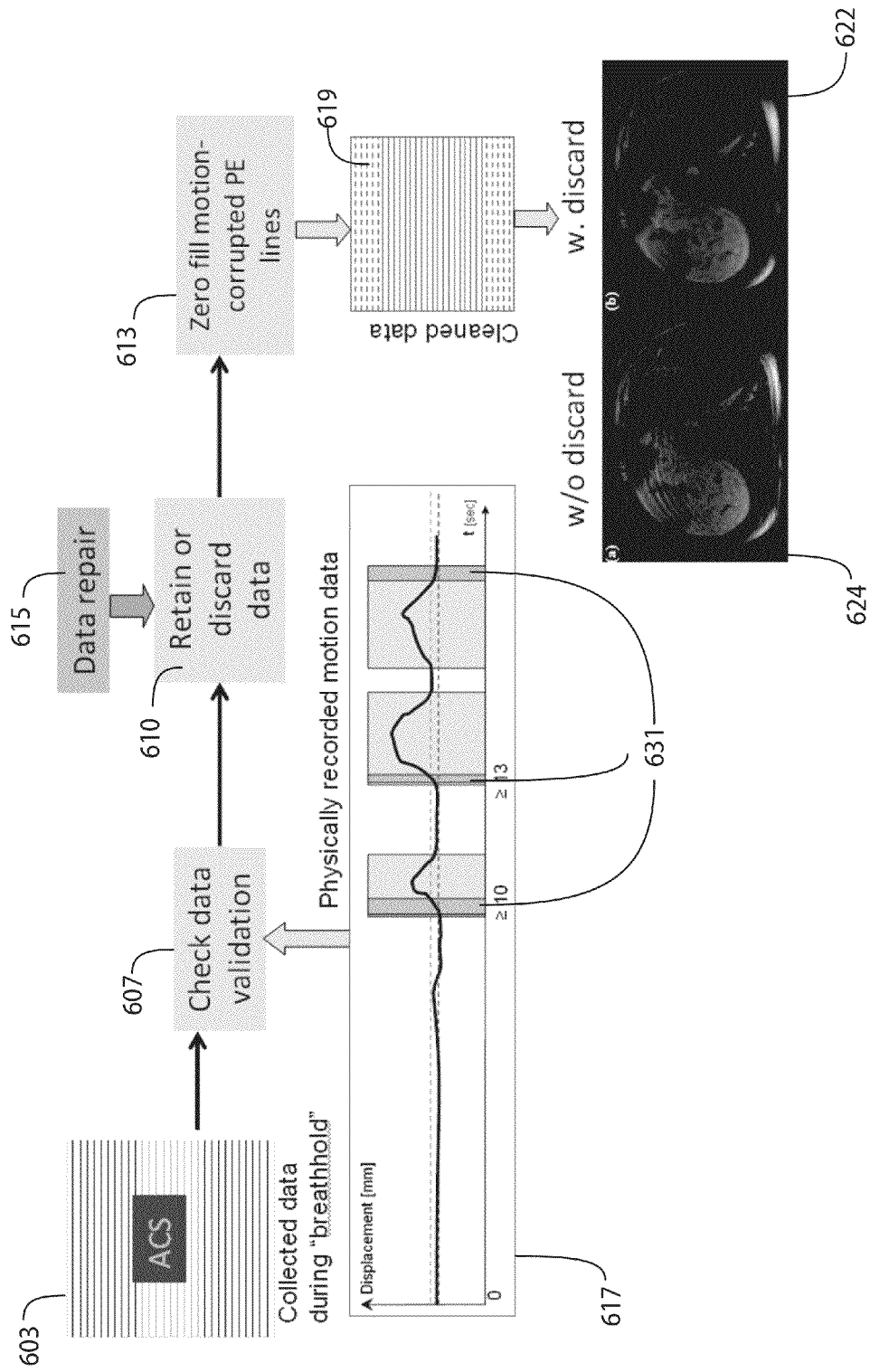
FIG. 6 shows a system for retrospectively using recorded physical motion information to identify data in k-space to be repaired for image reconstruction, according to an embodiment of the invention.

FIG. 6 shows system 600 for retrospectively using recorded physical motion information to identify data in k-space to be repaired for image reconstruction. The system identifies k-space image representative data that is contaminated to a limited extent by minor displacement using retrospectively recorded patient physical motion information and repairs the identified k-space data. System 600 retrospectively uses respiration tracking data synchronized with acquired k-space data for repairing motion contaminated image representative portions of the k-space data. Imaging system 10 (FIG. 3) performs a parallel RF coil, short TR, enhanced speed acquisition of k-space image data in step 603. The enhanced speed acquisition is performed by using patient breathhold to ensure central k-space data is free from motion introduced data error. A motion sensor such as a respiratory belt or other sensor attached to a patient or an imaging method, is used in step 617 to record a motion signal displacement synchronized with acquired k-space image data and indicating patient physical respiratory motion during the course of the parallel RF coil, short TR, k-space image data acquisition of step 603.

Computer 17 compares the motion signal displacement with a predetermined first threshold and a second higher threshold in step 607 to identify signal portions and corresponding k-space data where the motion signal displacement exceeds the predetermined thresholds. In step 610 computer 17 discards the identified k-space data corresponding to acquisition periods when the motion signal displacement exceeds the second threshold and repairs the k-space data identified corresponding to the motion signal displacement between the first and second thresholds using repair information 615. Computer 17 performs motion correction (repair) in k-space data 631 identified in darker shaded k-space data segments (step 617) based on tracked respiratory information by phase correction (0th and 1st order). Since the physical displacement is known already, the phase correction is taken as being substantially equal to the physical displacement ($\Delta d \approx \Delta \phi$). A rigid body displacement is equivalent to a phase shift in k-space. In step 613, computer 17 performs image reconstruction using cleaned and repaired data 619. In one embodiment, computer 17 stores zero fill data in the discarded k-space data portions to replace motion contaminated data. Image 622 is derived using motion determined discard and repair of k-space data and image 624 is derived without motion determined discard and repair of k-space data. System 600 identifies and repairs data which is slightly contaminated by motion. Specifically, when motion displacement is minor, system 600 advantageously deems displacement to approximate phase error. System 600 thereby uses displacement to remove phase error prior to image reconstruction. There are multiple different methods to correct k-space phase data and system 600 advantageously adaptively selects a method in response to data indicating type of acquisition pulse sequence used. Data in k-space is correlated with patient motion by synchronized recording of k-space data and a patient motion indicative signal.

Figure 7:
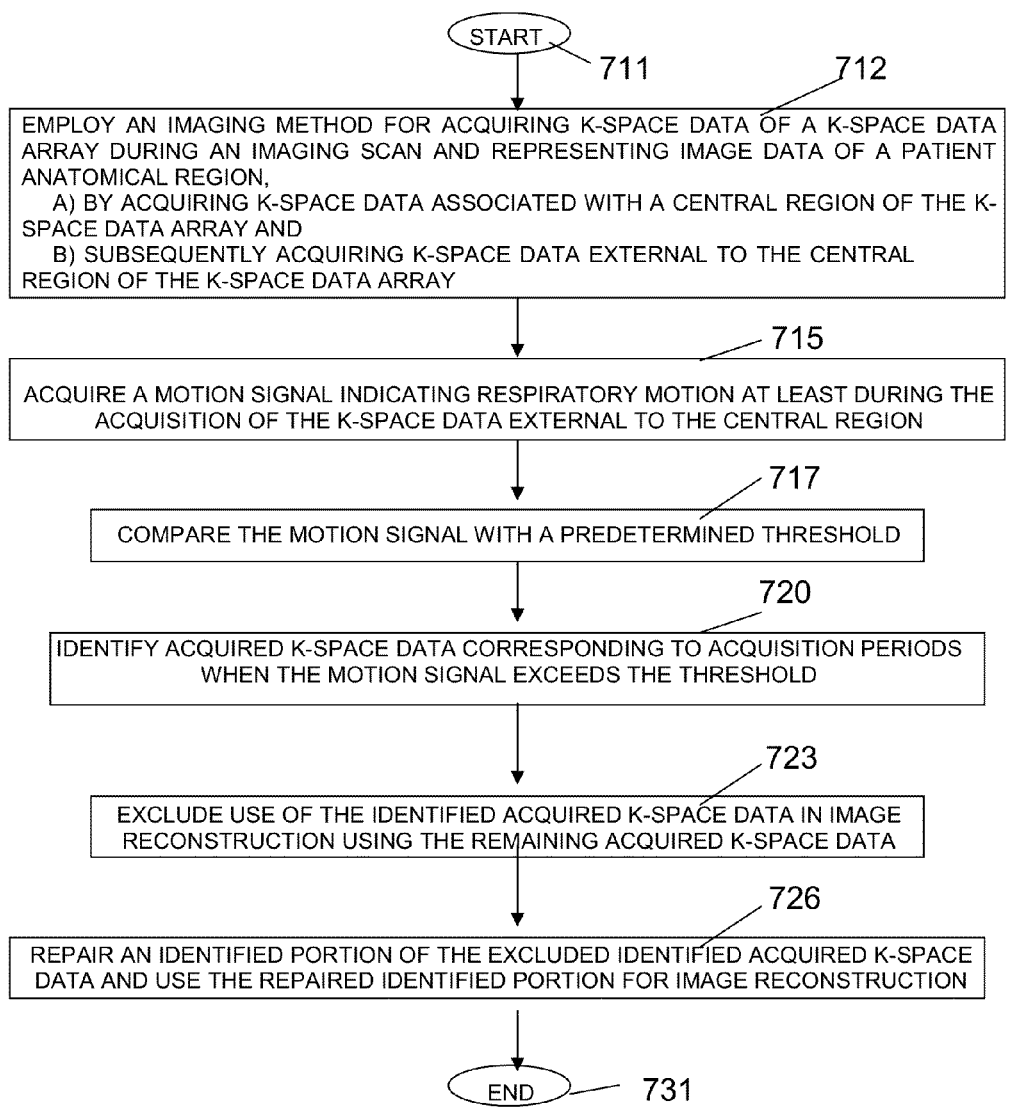
FIG. 7 shows a flowchart of a process performed by a system for providing motion corrected MR image data in an MR imaging system, according to an embodiment of the invention.

FIG. 7 shows a flowchart of a process performed for providing motion corrected MR image data in MR imaging system 10 (FIG. 3). In step 712, following the start at step 711, system 10 (FIG. 3) employs an imaging method for acquiring k-space data of a k-space data array during an imaging scan. The k-space data represents image data of a patient anatomical region. System 10 acquires k-space data associated with a central region of the k-space data array during a predetermined first period (such as an estimated breathhold period comprising 8-15 seconds, for example) and subsequently acquires k-space data external to the central region of the k-space data array following the predetermined first period. System 10 in one embodiment, acquires k-space data by employing an accelerated imaging method comprising a parallel imaging method comprising at least one of, (a) a GRAPPA (Generalized autocalibrating partially parallel acquisitions) method, (b) a Compressed sensing (CS) method, (c) a SENSE (SENSitivity Encoding) method, (d) a SMASH (SMASH (SiMultaneous Acquisition of Spatial Harmonics) method and (e), SPIR-iT, (Iterative Self-Contained Parallel Imaging reconstruction).

In step 715, computer 17 acquires a motion signal indicating respiratory motion at least during the acquisition of the k-space data external to the central region. Computer 17 acquires the motion signal by recording motion data for use in image reconstruction. The motion data is acquired from at least one of, (a) a sensor of a respiration tracking belt and (b) two dimensional or one dimensional navigation images. Computer 17 correlates the acquired k-space data associated with the central region with the acquired k-space data external to the central region to identify a portion of the excluded identified acquired k-space data usable for image reconstruction. Computer 17 in step 717 compares the motion signal with a predetermined threshold. In step 720, computer 17 identities acquired k-space data corresponding to acquisition periods when the motion signal exceeds the threshold.

Computer 17 in step 723 excludes use of the identified acquired k-space data in image reconstruction using the remaining acquired k-space data and in one embodiment substitutes null or blank data for the excluded identified acquired k-space data. Computer 17 in step 726 repairs an identified portion of the excluded identified acquired k-space data and uses the repaired identified portion for image reconstruction. The portion is identified as being associated with k-space data corresponding to motion displacement lying between two predetermined displacement thresholds, for example. The computer repairs the identified portion of the excluded identified acquired k-space data by applying a phase correction to a k-space data element derived from an associated patient respiratory physical displacement. Computer 17 substitutes repaired excluded identified acquired k-space data portions for the excluded identified acquired k-space data portions. In one embodiment computer 17 uses the identified portion of the excluded identified acquired k-space data for image reconstruction without repair. The process of FIG. 7 terminates at step 731.

Returning to FIG. 3, RF coils 4 emit RF pulses to excite nuclear proton spins in a patient on support table 5 in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via a radio-frequency amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Transverse plane inversion occurs in the x or y direction and longitudinal plane inversion occurs in the z plane.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

DEFINITIONS

EPI comprises Echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted).

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image luminance contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

TE (Echo Time) comprises a time period between the start of an RF pulse and the maximum in the received echo signal. The sequence is repeated every TR seconds.

B0 is the main static base MRI magnetic field.

B1 is the RF transmit coil field.

The system and processes of the FIGS. 3-7 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. A system uses breathhold, center-out k-space encoding and advantageously selects and repairs or discards motion contaminated data in a postprocessing stage comprehensively based on available respiratory related information. Further, the processes and applications may, in alternative embodiments, be located on one or more (e.g., distributed) processing devices on a network linking the units of FIG. 3. Any of the functions and steps provided in FIGS. 3-7 may be implemented in hardware, software or a combination of both. No claim element herein is to be construed under the provisions of 35 U.S.C. 112, sixth paragraph, unless the element is expressly recited using the phrase "means for."

What is claimed is:

1. A method for providing motion corrected MR image data in an MR imaging system, comprising the steps of:
    employing an imaging method for acquiring k-space data of a k-space data array during an imaging scan,
        a) by acquiring k-space data associated with a central region of the k-space data array and
        b) subsequently acquiring k-space data external to said central region of the k-space data array, said k-space data representing image data of a patient anatomical region;
    acquiring a motion signal indicating respiratory motion at least during the acquisition of said k-space data external to said central region;
    comparing said motion signal with a predetermined threshold;
    identifying acquired k-space data corresponding to acquisition periods when said motion signal exceeds said threshold; and
    excluding use of the identified acquired k-space data in image reconstruction using the remaining acquired k-space data.

2. A method according to claim 1, including the step of substituting null or blank data for the excluded identified acquired k-space data.

3. A method according to claim 1, wherein
    the step of acquiring said k-space data associated with said central region of the k-space data array occurs during a predetermined first period and
    the step of subsequently acquiring said k-space data external to said central region of the k-space data array follows said predetermined first period.

4. A method according to claim 3, wherein
    said predetermined first period comprises an estimated breathhold period.

5. A method according to claim 4, wherein
    said estimated breathhold period comprises 8-15 seconds.

6. A method according to claim 1, wherein
    the step of employing said imaging method for acquiring k-space data comprises employing an accelerated imaging method.

7. A method according to claim 6, wherein
    said accelerated imaging method comprises a parallel imaging method comprising at least one of, (a) a GRAPPA (Generalized autocalibrating partially parallel acquisitions) method, (b) a Compressed sensing (CS) method, (c) a SENSE (SENSitivity Encoding) method, (d) a SMASH (SMASH (SiMultaneous Acquisition of Spatial Harmonics) method and (e), SPIR-iT, (Iterative Self-Contained Parallel Imaging reconstruction).

8. A method according to claim 1, including the steps of repairing the excluded identified acquired k-space data and substituting repaired excluded identified acquired k-space data for said excluded identified acquired k-space data.

9. A method according to claim 1, including the step of correlating the acquired k-space data associated with said central region with the acquired k-space data external to said central region to identify a portion of said excluded identified acquired k-space data usable for image reconstruction.

10. A method according to claim 9, including the step of at least one of,
    (a) using the identified portion of said excluded identified acquired k-space data for image reconstruction and
    (b) repairing the identified portion of said excluded identified acquired k-space data and using the repaired identified portion for image reconstruction.

11. A method according to claim 1, wherein the step of acquiring said motion signal comprises recording motion data for use in said image reconstruction, said motion data being acquired from at least one of, (a) a sensor of a respiration tracking belt and (b) navigation images.

12. A method for providing motion corrected MR image data in an MR imaging system, comprising the steps of:

employing an imaging method for acquiring k-space data of a k-space data array during an imaging scan,
  a) by acquiring k-space data associated with a central region of the k-space data array and
  b) subsequently acquiring k-space data external to said central region of the k-space data array, said k-space data representing image data of a patient anatomical region;
acquiring a motion signal indicating respiratory motion at least during the acquisition of said k-space data external to said central region;
comparing said motion signal with a predetermined threshold;
identifying acquired k-space data corresponding to acquisition periods when said motion signal exceeds said threshold;
correlating the acquired k-space data associated with said central region with the acquired k-space data external to said central region to identify a portion of said excluded identified acquired k-space data usable for image reconstruction; and
excluding use of the identified acquired k-space data in image reconstruction using the remaining acquired k-space data.

13. A method according to claim 12, including the step of at least one of,
(a) using the identified portion of said excluded identified acquired k-space data for image reconstruction and
(b) repairing the identified portion of said excluded identified acquired k-space data and using the repaired identified portion for image reconstruction.

14. A system for providing motion corrected MR image data in an MR imaging system, comprising:
an imaging system for,
  employing an imaging method for acquiring k-space data of a k-space data array during an imaging scan,
    a) by acquiring k-space data associated with a central region of the k-space data array and
    b) subsequently acquiring k-space data external to said central region of the k-space data array, said k-space data representing image data of a patient anatomical region; and
at least one computer for,
  acquiring a motion signal indicating respiratory motion at least during the acquisition of said k-space data external to said central region,
  comparing said motion signal with a predetermined threshold,
  identifying acquired k-space data corresponding to acquisition periods when said motion signal exceeds said threshold, and
  excluding use of the identified acquired k-space data in image reconstruction using the remaining acquired k-space data.

15. A system according to claim 14, wherein
said at least one computer substitutes null or blank data for the excluded identified acquired k-space data.

16. A system according to claim 14, wherein
said at least one computer acquires said k-space data associated with said central region of the k-space data array during a predetermined first period and acquires said k-space data external to said central region of the k-space data array following said predetermined first period.

17. A system according to claim 16, wherein
said predetermined first period comprises an estimated breathhold period.

18. A system according to claim 17, wherein
said estimated breathhold period comprises 8-15 seconds.

19. A system according to claim 14, wherein
said imaging system acquires k-space data by employing an accelerated imaging system.

20. A system according to claim 19, wherein
said accelerated imaging system comprises a parallel imaging method comprising at least one of, (a) a GRAPPA (Generalized autocalibrating partially parallel acquisitions) method, (b) a Compressed sensing (CS) method, (c) a SENSE (SENSitivity Encoding) method, (d) a SMASH (SMASH (SiMultaneous Acquisition of Spatial Harmonics) method and (e), SPIR-iT, (Iterative Self-Contained Parallel Imaging reconstruction).

21. A system according to claim 14, wherein
said at least one computer repairs the excluded identified acquired k-space data and substitutes repaired excluded identified acquired k-space data for said excluded identified acquired k-space data.

22. A system according to claim 14, wherein
said at least one computer correlates the acquired k-space data associated with said central region with the acquired k-space data external to said central region to identify a portion of said excluded identified acquired k-space data usable for image reconstruction.

23. A system according to claim 22, wherein
said at least one computer at least one of,
(a) uses the identified portion of said excluded identified acquired k-space data for image reconstruction and
(b) repairs the identified portion of said excluded identified acquired k-space data and using the repaired identified portion for image reconstruction.

24. A system according to claim 23, wherein
said at least one computer repairs the identified portion of said excluded identified acquired k-space data by applying a phase correction to a k-space data element derived from an associated patient respiratory physical displacement.

25. A system according to claim 14, wherein
said at least one computer acquires said motion signal comprises recording motion data for use in said image reconstruction, said motion data being acquired from at least one of, (a) a sensor of a respiration tracking belt and (b) navigation images.

* * * * *